United States Patent
Tofilescu

(10) Patent No.: US 10,787,079 B2
(45) Date of Patent: Sep. 29, 2020

(54) VEHICLE GROUND PATH IMPEDANCE DIFFERENCE DETECTION

(71) Applicant: Ford Global Technologies, LLC, Dearborn, MI (US)

(72) Inventor: Pompilian Tofilescu, Lincoln Park, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/144,653

(22) Filed: Sep. 27, 2018

(65) Prior Publication Data
US 2020/0101847 A1 Apr. 2, 2020

(51) Int. Cl.
| | |
|---|---|
| *B60L 3/00* | (2019.01) |
| *G01R 31/02* | (2006.01) |
| *G01R 31/00* | (2006.01) |
| *G01R 19/165* | (2006.01) |
| *G01R 1/20* | (2006.01) |
| *G01R 31/50* | (2020.01) |
| *G01R 19/00* | (2006.01) |

(52) U.S. Cl.
CPC .......... *B60L 3/0069* (2013.01); *G01R 1/203* (2013.01); *G01R 19/16528* (2013.01); *G01R 31/007* (2013.01); *G01R 31/50* (2020.01); *G01R 19/0092* (2013.01)

(58) Field of Classification Search
CPC ....... B60L 3/0069; G01R 31/50; G01R 1/203; G01R 31/007; G01R 19/16528; G01R 19/0092
See application file for complete search history.

(56) References Cited

U.S. PATENT DOCUMENTS

| | | | |
|---|---|---|---|
| 8,164,344 B2 | 4/2012 | Yano et al. | |
| 8,373,950 B2 | 2/2013 | Yano et al. | |
| 2003/0158677 A1* | 8/2003 | Swarztrauber | .... H02J 13/00007 702/62 |
| 2005/0232632 A1* | 10/2005 | Okubo | ................... H04B 10/27 398/71 |
| 2009/0222124 A1* | 9/2009 | Latwesen | ............ F16K 37/0083 700/110 |

(Continued)

FOREIGN PATENT DOCUMENTS

| | | |
|---|---|---|
| CN | 104111399 A | 10/2014 |
| JP | 2018042403 A | 3/1918 |

(Continued)

*Primary Examiner* — Christopher P McAndrew
*Assistant Examiner* — Zannatul Ferdous
(74) *Attorney, Agent, or Firm* — Frank Lollo; Eversheds Sutherland (US) LLP

(57) ABSTRACT

Circuits and methods are disclosed for determining a ground path impedance difference in a vehicle having master and slave control. An example circuit for detecting a difference in ground path impedance in a vehicle includes a master ground terminal and a slave ground terminal. The circuit also includes a first shunt resistor electrically coupled between the master ground terminal and a common internal ground, and a second shunt resistor electrically coupled between the slave ground terminal and the common internal ground. The circuit further includes a bi-directional current sense amplifier having as inputs the master ground terminal and the slave ground terminal.

3 Claims, 3 Drawing Sheets

(56) References Cited

U.S. PATENT DOCUMENTS

| | | | |
|---|---|---|---|
| 2010/0207635 A1* | 8/2010 | Plagens | G01R 31/50 324/509 |
| 2010/0246081 A1* | 9/2010 | Yano | B60L 3/0023 361/91.5 |
| 2013/0258531 A1* | 10/2013 | Li | B60L 3/04 361/42 |
| 2015/0249466 A1* | 9/2015 | Elyada | H03M 1/70 341/144 |
| 2015/0311994 A1* | 10/2015 | Thiele | H04B 7/0417 370/329 |
| 2017/0089955 A1* | 3/2017 | Yugou | G01R 19/10 |

FOREIGN PATENT DOCUMENTS

| | | |
|---|---|---|
| JP | 5091973 B2 | 9/2012 |
| WO | WO 2017008057 A1 | 1/1917 |

* cited by examiner

VEHICLE GROUND PATH IMPEDANCE DIFFERENCE DETECTION

TECHNICAL FIELD

The present disclosure generally relates to vehicle electronics and, more specifically, systems and methods for detecting a ground path impedance difference in a vehicle a master-slave circuitry arrangement.

BACKGROUND

Many modern vehicles may include redundant control (e.g., master and slave control) of various vehicle systems, including steering, brakes, lighting, and more. These systems make use of two microcontrollers or microprocessor units to ensure safety in the event of a failure of the master control. These systems may further include full dual redundant power supply feed and return such that each side can operate even if the other side short circuits or otherwise fails.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown describing systems, apparatuses, and methods for determining a difference in ground path impedance for a vehicle having two ground paths, corresponding to a master side and a slave side of a vehicle control circuit. An example circuit for detecting a difference in ground path impedance in a vehicle includes a master ground terminal, and a slave ground terminal. The circuit also includes a first shunt resistor electrically coupled between the master ground terminal and a common internal ground, and a second shunt resistor electrically coupled between the slave ground terminal and the common internal ground. The circuit further includes a bi-directional current sense amplifier having as inputs the master ground terminal and the slave ground terminal.

An example disclosed method for determining a difference in ground path impedance includes determining a first ground path impedance for a vehicle having (i) master and slave ground terminals (ii) master and slave shunt resistors coupled respectively between a common internal ground and the master and slave ground terminals, and (iii) a bi-directional current sense amplifier. The method also includes determining a second ground path impedance based on the first ground path impedance. And the method further includes determining a difference between the first and second ground path impedances.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
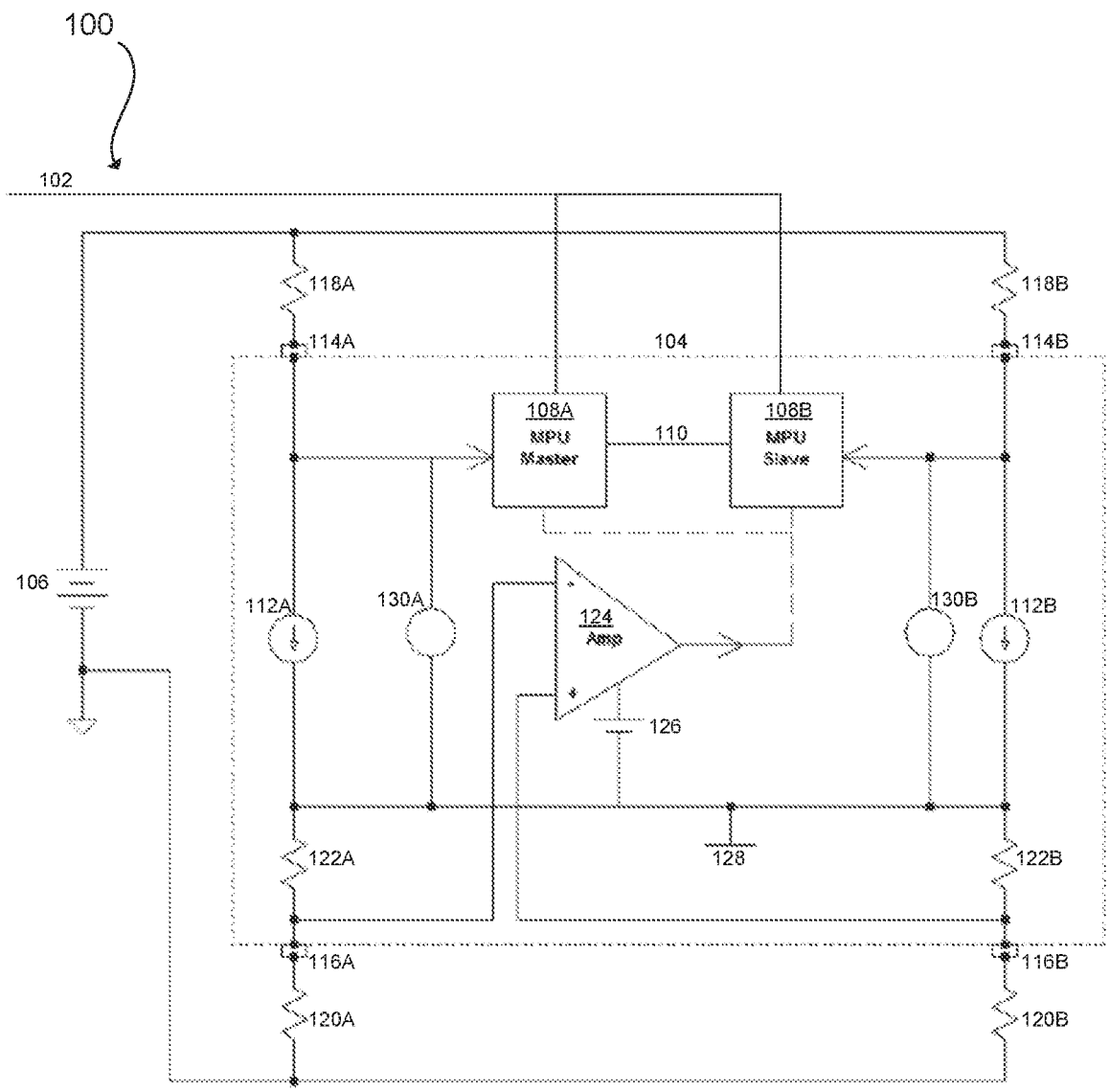
FIG. 1 illustrates an example circuit configured to determine a difference in ground path impedances of a vehicle according to embodiments of the present disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

As noted above, many modern vehicles may include dual control via master and slave controllers and/or microprocessors. This may be due to safety concerns, particularly when various safety related systems and applications are electronically controlled. Many vehicles include redundant control using two micro-controllers or microprocessors, requiring fully redundant power supply and return.

For these types of electronic control units, there may be two types of internal grounding strategies. First, the ground for each of the master and control units may be galvanically isolated. Using galvanically isolated grounds for the master and slave controllers may introduce various drawbacks to the vehicle manufacturing, such as increasing circuit complexity, costs, and more.

A second grounding strategy may include a common master and slave internal ground. This has the benefit of reduced complexity, but introduces its own set of problems.

Using a common internal ground can cause issues when one of the ground returns of the master or slave side is disconnected, degraded, or otherwise does not function properly. In this case, the entire load current will return through the single remaining ground return path. And for vehicle ECUs having a high load (e.g., high power DC to DC converters, electrical power steering, etc.), using a single return path can result in reduced ECU functionality or even loss of function due to the increased voltage drop on the return path. The reduced functionality or loss of function can cause safety concerns that should be avoided.

In some cases, one solution may be to increase the wire harness current carrying capability, to enable a single return path to accommodate the entire load current. However this increases the cost and weight of the vehicle. Another solution may include the ECU integrating open ground detection and diagnostic.

With the above issues in mind, some embodiments of the present disclosure may include monitoring the ground path impedance to determine when one or both of the return paths has degraded, become disconnected, or otherwise has changed its operating characteristics. Some embodiments may include placing a first current sense shunt resistor between a ground terminal of the master side and the common internal ground, placing a second current sense shunt resistor between a slave side ground terminal and the common internal ground. The circuit may then include two amplifiers (one coupled to each shunt resistor respectively), whose outputs can be used to determine whether there is an issue with the master or slave ground return path.

To reduce the circuit complexity (and therefore cost), some examples may instead include a single amplifier having as inputs the master and slave ground terminals. The placement of the shunt resistors, amplifier, and ground path impedances may enable the vehicle to determine a difference in the ground path impedances of the master side and slave side. This can then be used to alert a driver, manufacturer, mechanic, or other party that the vehicle ground path should be checked. Other actions can be taken as well, such as limiting functionality of one or more systems, to ensure that all appropriate safety systems can still function. This might include, for example, powering off one or more systems to reduce a load, limiting a current drawn by one or more systems, alerting a driver of the vehicle to pull over the vehicle, or taking some other action.

FIG. 1 illustrates an example circuit 100 of the present disclosure, configured to allow a determination of the difference in the ground path impedances of the master side and the ground side. Circuit 100 may be used in connection with one or more ECUs of a vehicle. The vehicle may be a standard gasoline powered vehicle, a hybrid vehicle, an electric vehicle, a fuel cell vehicle, or any other mobility implement type of vehicle. The vehicle may be non-autonomous, semi-autonomous, or autonomous. The vehicle may include parts related to mobility, such as a powertrain with an engine, a transmission, a suspension, a driveshaft, and/or wheels, etc. The vehicle may also include one or more electronic components not shown in FIG. 1, but described below with respect to FIG. 2.

As shown in FIG. 1, circuit 100 may include various controllers, processors, circuit elements, and other components. These features include:

| | |
|---|---|
| 102 | Vehicle Communication Bus (CAN) |
| 104 | Electronic Control Unit (ECU) |
| 106 | Vehicle Battery (BATT) |
| 108A | Master microprocessor unit (MPU) |
| 108B | Slave microprocessor unit (MPU) |
| 110 | Internal Master/Slave Communication (Comm) |
| 112A | Total Master Side Current ($I_{Load1}$) |
| 112B | Total Slave Side Current ($I_{Load2}$) |
| 114A | Master Battery Terminal (BT1) |
| 114B | Slave Battery Terminal (BT2) |
| 116A | Master Ground Terminal (GT1) |
| 116B | Slave Ground Terminal (GT2) |
| 118A | Master Power Path Impedance ($R_{P1}$) |
| 118B | Slave Power Path Impedance ($R_{P2}$) |
| 120A | Master Ground Path Impedance ($R_{G1}$) |
| 120B | Slave Ground Path Impedance ($R_{G2}$) |
| 122A | Master Current Sense Shunt Resistor ($R_{GS1}$) |
| 122B | Slave Current Sense Shunt Resistor ($R_{GS2}$) |
| 124 | Common Mode Bi-Directional Current Amplifier (Amp) |
| 126 | Amplifier Reference Voltage ($V_{REF}$) |
| 128 | Common Internal Ground |
| 130A | Master-Common Ground Voltage ($V_{B1}$) |
| 130B | Slave-Common Ground Voltage ($V_{B2}$) |

The CAN bus 102 provides communication between the master MPU 108A and one or more other vehicle systems, such as other ECUs operating in the vehicle. The ECU 104 may include the master and slave MPUs 108A and 108B, as well as various other components described herein for the purpose of detecting a difference in the ground path impedance of the ECU 104. In some examples, bus 102 may be a different type of communication bus, such as Ethernet, MOST, GMSL, LIN, and more. As shown in FIG. 1, bus 102 maybe communicatively coupled to either or both of the master MPU 108A or the slave MPU 108B.

The battery 106 may provide power to the various loads of the ECU 104. The MPUs 108A and 108B may control the operation of various loads of the ECU 104 (not shown). The MPUs 108A and/or 108B may also determine the ground path impedances 120A and 120B, so as to provide an alert to a driver of the vehicle if there is a potential issue.

The internal master/slave communication path 110 may provide the ability for the master and slave MPUs 108A and 108B to communicate with each other, to share information such as current operating status, known and/or measure currents and voltages, and more.

The total master and slave side currents 112A and 112B may be the total current drawn by any loads operating and controlled by the master and slave MPUS 108A and 108B.

The master battery terminal 114A and slave battery terminal 114B may be the connection between the vehicle battery 106 and the ECU 104. Similarly, the master ground terminal 116A and slave ground terminal 116B may be the corresponding connections between the vehicle battery 106 and the ECU 104.

The master and slave power path impedances 118A and 118B may be the resistance or impedance inherent in the connection from the battery to the master and slave battery terminals, including the resistance due to the wiring (i.e., wire harness), as well as in the connections between various elements such as the wiring, eyelets, electrodes, etc. This impedance may be generally a known value during the manufacture of the vehicle, and may be stored for use in the methods of this disclosure. In some examples, the power path impedance may be detected, calculated, or otherwise determined by one or more of the MPUs 108A and 108B.

The master and slave ground path impedances 120A and 120B may be the resistance or impedance inherent in the connection from the ground terminals 116A and 116B to the vehicle battery 106. The master and slave ground path impedances 120A and 120B may change based on an age of the vehicle, corrosion over time, loose wiring, vibrations, becoming dislodged or disconnected, or for various other reasons. As noted above, if the ground path impedances are significantly different from each other (i.e., they differ by larger than a threshold amount or percentage), the return current will be unevenly split between the two return paths. This can result in one ground path conducting significantly higher current than the other. In some examples, the current conducted may be higher than the rating for the ground path, which can cause short circuiting, faults, reduced functionality, and other issues with vehicle operation.

The master and slave current sense shunt resistors 122A and 122B may be any suitable resistors that are positioned in the circuit 100 between the common internal ground 128 and the ground terminals 116A and 116B of the ECU 104 respectively. In some examples, the shunt resistors 122A and 122B may be the same value, or may be within a threshold of each other (e.g., within 1%). For instance, both shunt resistors may have a value of 0.002Ω.

The amplifier 124 may be configured to receive two inputs, and multiply a difference between the inputs by a gain value inherent to the amplifier. As shown in FIG. 1, the two inputs to the amplifier 124 may be the master ground terminal 116A and the slave ground terminal 116B. The reference voltage 126 for the amplifier may be coupled to the common internal ground 128. In this configuration, the shunt resistors and ground path impedances act as a Wheatstone bridge, allowing the amplifier to determine a difference between the two ground path impedances based on the known values of the shunt resistors. The resulting output may then be input to the MPUS 108A and/or 108B, allowing for one or more actions to be taken when a significant difference is detected.

The master to common ground voltage 130A and slave to common ground voltage 130B may be the measured voltage between the respective battery terminals 114A and 114B and the common internal ground 128. Voltage 130A may be the voltage between the master power terminal and the common ground, while voltage 130B may be the voltage between the slave power terminal and the common ground.

One or more of the values and/or elements described above may be detected or measured by various elements of the vehicle. For instance, the voltages and currents passing through various elements of the circuit 100 may be measured by the master and/or slave MPUs 108A and 108B.

Based on the circuit shown in FIG. 1, various voltages, currents, and impedances can be determined. These determined values can be used to then determine a difference between the ground path impedances 120A and 120B. First, a voltage input to the amplifier 124 may be defined as:

$$V_{IN} = I * \frac{R_{GS}*(R_{G1}-R_{G2})}{2R_{GS}+R_{G1}+R_{G2}} \quad (1)$$

In equation (1), the current I is the total current across the loads of both the slave and the master side. As such, the total current I is $I_{Load1}+I_{Load2}$. $R_{GS}$ is the value of the current shunt resistors (which may be selected to be the same value). And $R_{G1}$ and $R_{G2}$ are the ground path impedances 120A and 120B respectively.

If the amplifier 124 gain is known, and the total current I is known, then the voltage output of the amplifier and input into the MPUs 108A and/or 108B ($V_{ADC}$) is:

$$V_{ADC} = V_{REF} + \text{Gain} * I \frac{R_{GS}*(R_{G1}-R_{G2})}{2R_{GS}+R_{G1}+R_{G2}} \quad (2)$$

In equation (2), $V_{REF}$ is the amplifier reference voltage 126, and the Gain is a known value based on the characteristics of the amplifier 124.

In some examples, a first of the two ground path impedances may be known. In this case, the second ground path impedance can be calculated based on the known or measured values $V_{ADC}$, $V_{REF}$, Gain, I, $R_{GS}$, and $R_{G(1 \text{ or } 2)}$. For example, if only one ground path impedance $R_{G1}$ is known:

$$R_{G2} = \frac{R_{G1}V_{REF}+2R_{GS}V_{REF}-R_{G1}V_{ADC}-2R_{GS}V_{ADC}+IR_{G1}R_{GS}\text{Gain}}{V_{ADC}-V_{REF}+1+R_{GS}\text{Gain}} \quad (3)$$

The ground impedance difference between the master ground path impedance 120A and the slave ground path impedance 120B can then be determined to be:

$$R_{DIFF} = R_{G1} - \frac{R_{G1}V_{REF}+2R_{GS}V_{REF}-R_{G1}V_{ADC}-2R_{GS}V_{ADC}+IR_{G1}R_{GS}\text{Gain}}{V_{ADC}-V_{REF}+1+R_{GS}\text{Gain}} \quad (4)$$

In some examples, neither of the ground path impedances 120A and 120B may be known. In this case, one of the power path impedances 118A or 118B may be known or assumed, and the ground path impedance difference may then be determined. One or both of the power path impedances 118A and 118B may be determined based on a manufacturer value, or a value determine based on the specification of the circuit. For instance, if the characteristics of the wire harness used to connect the battery 106 to the ECU 104 is known, then a power path impedance 118A and/or 118B may be determined.

Taking the master side power path impedance 118A for example, in order to determine whether to use the stored manufacturer power path impedance 118A value the circuit may determine whether the measured master to common ground voltage 130A is within a threshold amount of the vehicle battery 106 voltage. One or both of these values may be determined by the master MPU 108A. If the voltages are within a threshold of each other, that may indicate that the power path impedance 118A is within range of its specification, and its manufactured value may be used.

If the first power path impedance 118A ($R_{P1}$) is known or assumed (i.e., $R_{P1}=R_P$), then the structure of the circuit 100 results in the following relationship:

$$V_{BATT} = R_P I_{Load1} + V_B + I\frac{(R_{GS}+R_{G1})(R_{GS}+R_{G2})}{2R_{GS}+R_{G1}+R_{G2}} \quad (5)$$

The ground path impedances 120A and 120B, and the difference between them can then be determined using the following equations:

$$R_{G1} = -\frac{R_{GS}V_{REF}-V_{ADC}+2V_{B1}\text{Gain}-2\text{Gain}V_{BATT}+IR_{GS}\text{Gain}+2R_P\text{Gain}I_{Load1}}{V_{REF}-V_{ADC}+Ir_{GS}\text{Gain}} \quad (6)$$

$$R_{G2} = -\frac{R_{GS}V_{ADC}-R_{GS}V_{REF}+2V_{B1}R_{GS}\text{Gain}-2R_{GS}\text{Gain}V_{BATT}+IR_{GS}^2\text{Gain}+2R_P R_{GS}\text{Gain}I_{Load1}}{V_{ADC}-V_{REF}+IR_{GS}\text{Gain}} \quad (7)$$

$$R_{DIFF} = -\frac{4R_{GS}\text{Gain}(V_{REF}-V_{ADC})(V_{B1}-V_{BATT}+R_P I_{Load1})}{V_{REF}^2-I^2 R_{GS}^2 \text{Gain}^2 -2V_{REF}V_{ADC}+V_{ADC}^2} \quad (8)$$

Figure 2:
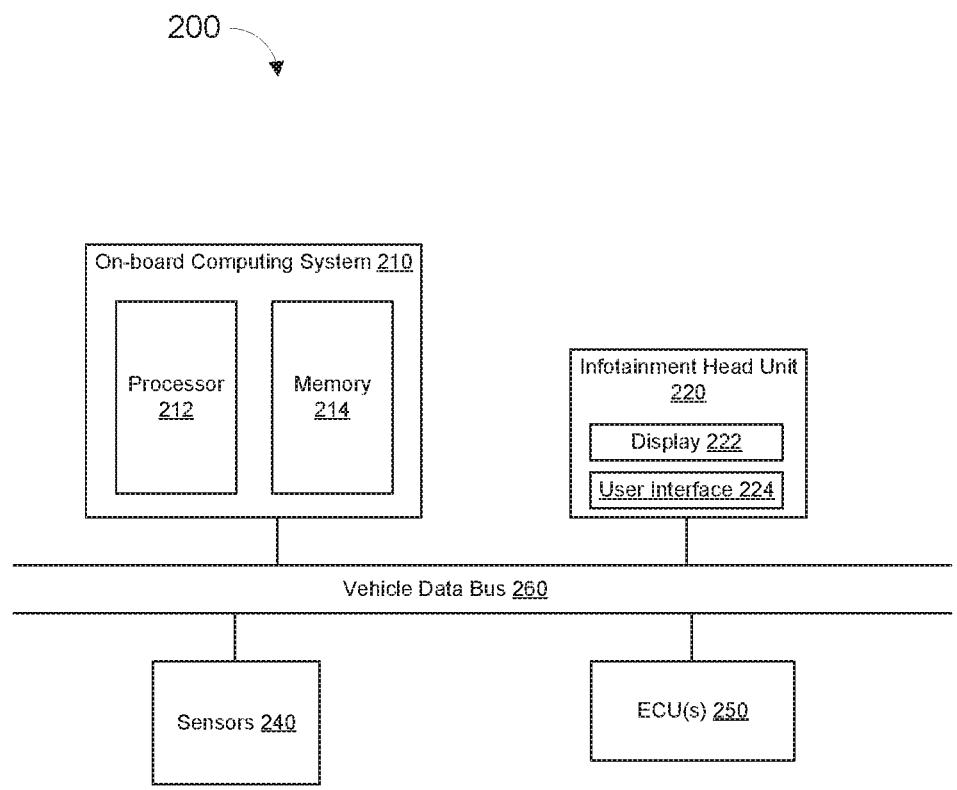
FIG. 2 illustrates an example block diagram of electronic components of the vehicle of FIG. 1.

FIG. 2 illustrates an example block diagram 200 showing electronic components of a vehicle, according to some embodiments. In the illustrated example, the electronic components 200 include the on-board computing system 210, infotainment head unit 220, sensors 240, electronic control unit(s) 250, and vehicle data bus 260. The circuit 100 may be used in connection with one or more of the ECUs 240.

The on-board computing system 210 may include a microcontroller unit, controller or processor 212 and memory 214. Processor 212 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory 214 may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc.). In some examples, the memory 214 includes multiple kinds of memory, particularly volatile memory and non-volatile memory.

The memory 214 may be computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory 214, the computer readable medium, and/or within the processor 212 during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

The infotainment head unit 220 may provide an interface between the vehicle and a user. The infotainment head unit 220 may include a user interface 224 having one or more input and/or output devices. The input devices may include, for example, a control knob, an instrument panel, a digital camera for image capture and/or visual command recognition, a touch screen, an audio input device (e.g., cabin microphone), buttons, or a touchpad. The output devices may include instrument cluster outputs (e.g., dials, lighting devices), actuators, a heads-up display, a center console display (e.g., a liquid crystal display (LCD), an organic light emitting diode (OLED) display, a flat panel display, a solid state display, etc.), and/or speakers. In the illustrated example, the infotainment head unit 220 includes hardware (e.g., a processor or controller, memory, storage, etc.) and software (e.g., an operating system, etc.) for an infotainment system (such as SYNC® and MyFord Touch® by Ford®, Entune® by Toyota®, IntelliLink® by GMC®, etc.). In some examples the infotainment head unit 220 may share a processor with on-board computing system 210. Additionally, the infotainment head unit 220 may display the infotainment system on, for example, a center console display 222 of vehicle 100. In some examples, an alert may be shown on display 222 indicating that the vehicle has switched the high voltage controller from a first power supply bus to a second power supply bus. This may provide a driver or passenger with information so as to safely stop the vehicle and/or take the vehicle to get maintenance or repairs completed.

Sensors 240 may be arranged in and around the vehicle in any suitable fashion. Sensors 240 may include one or more voltage sensors, current sensors, or other components configured to determine the voltages, currents, and resistances or impedances disclosed herein with respect to FIG. 1. Other sensors may be included as well.

The ECUs 250 may monitor and control subsystems of the vehicle. ECUs 250 may communicate and exchange information via vehicle data bus 260. Additionally, ECUs 250 may communicate properties (such as, status of the ECU 250, sensor readings, control state, error and diagnostic codes, etc.) to and/or receive requests from other ECUs 250. Some vehicles may have seventy or more ECUs 250 located in various locations around the vehicle communicatively coupled by vehicle data bus 260. ECUs 250 may be discrete sets of electronics that include their own circuit(s) (such as integrated circuits, microprocessors, memory, storage, etc.) and firmware, sensors, actuators, and/or mounting hardware. In the illustrated example, one or more of the ECUs 250 may include the circuit 100 shown and described with respect to FIG. 1.

Vehicle data bus 260 may include one or more data buses that communicatively couple the on-board computing system 210, infotainment head unit 220, sensors 240, ECUs 250, and other devices or systems connected to the vehicle data bus 260. In some examples, vehicle data bus 260 may be implemented in accordance with the controller area network (CAN) bus protocol as defined by International Standards Organization (ISO) 11898-1. Alternatively, in some examples, vehicle data bus 260 may be a Media Oriented Systems Transport (MOST) bus, or a CAN flexible data (CAN-FD) bus (ISO 11898-7).

Figure 3:
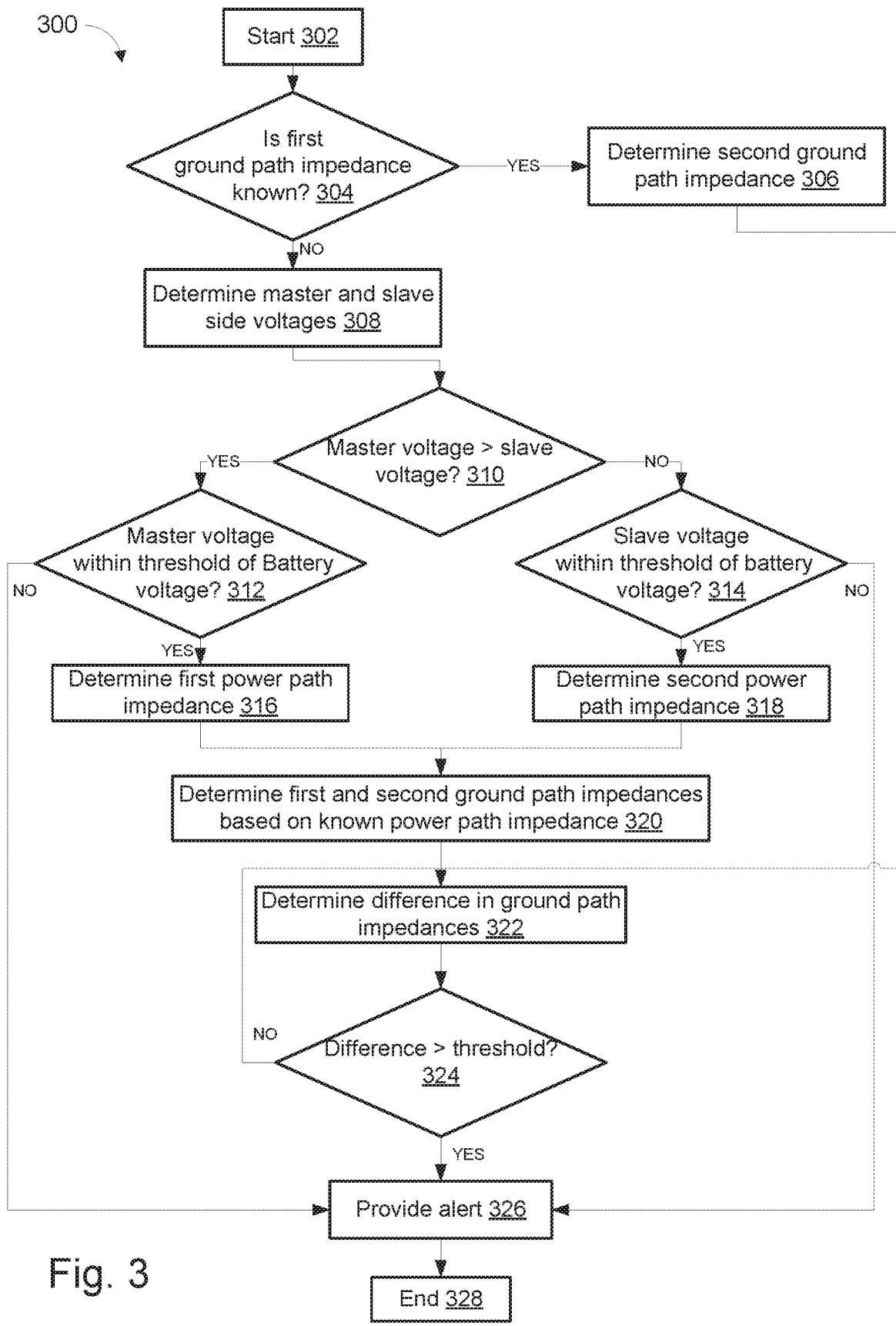
FIG. 3 illustrates a flowchart of an example method according to embodiments of the present disclosure.

FIG. 3 illustrates a flowchart of an example method 300 according to embodiments of the present disclosure. Method 300 may enable a vehicle to determine when there is an issue with a ground path impedance for vehicle having both master and slave ground paths. The flowchart of FIG. 3 is representative of machine readable instructions that are stored in memory (such as memory 214) and may include one or more programs which, when executed by a processor (such as processor 212, master MPU 108A, and/or slave MPU 108B) may cause a vehicle, processor, and/or one or more systems or devices to carry out one or more functions described herein. While the example program is described with reference to the flowchart illustrated in FIG. 3, many other methods for carrying out the functions described herein may alternatively be used. For example, the order of execution of the blocks may be rearranged or performed in series or parallel with each other, blocks may be changed, eliminated, and/or combined to perform method 300. Further, because method 300 is disclosed in connection with the components of FIGS. 1-2, some functions of those components will not be described in detail below.

Method 300 may start at block 302. At block 304, method 300 may include determining whether a first ground path impedance is known. The first ground path impedance may be known if it has been previously measured or calculated and stored in memory. If the first ground path impedance is known, method 300 may include determining the second ground path impedance at block 306. This may be done using the equations described above, particularly equation (3).

Then, when both ground path impedances are known method 300 may proceed to block 322 where a difference is determined.

However, if neither ground path impedance is known at block 304, method 300 may include determining the master side voltage and the slave side voltage. At block 310, method 300 may then include comparing the master voltage to the slave voltage. The higher of the two voltages may correspond to the side that has the lowest voltage drop across the external battery harness between the vehicle battery and the ECU.

If the master side voltage is higher than the slave side voltage, method 300 may include comparing the master side voltage to the battery voltage at block 312. If the master voltage is within a threshold difference from the battery voltage (e.g., within some percentage such as 1%, or within a measuring error) then the method proceeds to block 316. At block 316, method 300 may include determining a first power path impedance.

Alternatively, if the slave voltage is higher than the master voltage, method 300 may proceed to block 314. At block 314, method 300 may include comparing the slave voltage to the batter voltage. If the slave voltage is within a threshold difference from the battery voltage (e.g., within some percentage such as 1%, or within a measuring error) then the method proceeds to block 318. At block 318, method 300 may include determining a second power path impedance.

If, however, the master voltage is higher than the slave voltage, and the master voltage is different from the battery voltage by a significant amount (e.g., outside the threshold difference), method 300 may proceed to block 326 at which an alert is provided. This alert may indicate that there is a fault in the system. Similarly, if the slave voltage is higher than the master voltage, and the slave voltage is difference from the battery voltage by a significant amount (e.g., outside the threshold difference), method 300 may also proceed to block 316.

At block 320, method 300 may include determining the first and second ground path impedances. This may include determining the first and second ground path impedances based on either the first or second power path impedance, determine in blocks 316 and 318 (i.e., based on which path the method took.)

At block 322, method 300 may then determine a difference in the ground path impedances. If the difference is larger than a threshold amount (e.g., some percentage such as 1% or more), method 300 may proceed to block 326 at which an alert is provided. The alert may indicate that there is a fault, that there is a grounding issue, or some other type of information. Method 300 may end at block 328.

In some examples, the method may continue to monitor the ground path impedances, and the difference between them, over time. This may occur at regular intervals, such as every second, minute, hour, or more. Patterns in the ground path impedance difference over time may indicate that there is a grounding issue with either or both of the master and slave sides. This information may be used to provide additional alerts and/or information to a driver of the vehicle, so that appropriate corrective measures can be taken.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A circuit for detecting a difference in ground path impedance in a vehicle comprising:
   a master microprocessor unit and a slave microprocessor unit both electrically coupled to a common internal ground;
   a master ground terminal that forms a return path from the common internal ground back to the master microprocessor unit;
   a slave ground terminal that forms a return path from the common internal ground back to the slave microprocessor unit;
   a first shunt resistor electrically coupled between the master ground terminal and the common internal ground;
   a second shunt resistor electrically coupled between the slave ground terminal and the common internal ground; and
   a bi-directional current sense amplifier having as inputs the master ground terminal and the slave ground terminal, the bi-directional current sense amplifier having outputs to the master microprocessor unit and the slave microprocessor unit.

2. The circuit of claim 1, wherein the bi-directional current sense amplifier is configured to provide an output corresponding to a voltage difference between the master ground terminal and the slave ground terminal.

3. The circuit of claim 1, wherein an output of the bi-directional current sense amplifier is electrically coupled to a master microprocessor unit of the vehicle, wherein the master microprocessor is configured to determine that a difference exists between an impedance of the common internal ground and an impedance of the master ground terminal and the common internal ground and the slave ground terminal.

* * * * *